United States Patent
Nitta et al.

(10) Patent No.: US 6,787,290 B2
(45) Date of Patent: Sep. 7, 2004

(54) POSITIVE-WORKING PHOTORESIST COMPOSITION AND RESIST PATTERNING METHOD USING SAME

(75) Inventors: Kazuyuki Nitta, Ebina (JP); Kazufumi Sato, Sagamihara (JP); Daisuke Kawana, Kanagawa-ken (JP); Satoshi Shimatani, Yokohama (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/928,430

(22) Filed: Aug. 14, 2001

(65) Prior Publication Data

US 2002/0045130 A1 Apr. 18, 2002

(30) Foreign Application Priority Data

Aug. 31, 2000 (JP) ........................................ 2000-264529

(51) Int. Cl.$^7$ .......................... G03C 1/73; G03F 7/039; G03F 7/20; G03F 7/30; G03F 7/40
(52) U.S. Cl. ............................... 430/288.1; 430/281.1; 430/270.1; 430/326; 430/328; 430/330; 430/331; 430/905; 430/914
(58) Field of Search .......................... 430/288.1, 270.1, 430/905, 326, 327, 328, 330, 331, 281, 1, 914

(56) References Cited

U.S. PATENT DOCUMENTS

| | | | |
|---|---|---|---|
| 5,876,900 A | 3/1999 | Watanabe et al. | 430/288.1 |
| 5,939,235 A | 8/1999 | Kondo et al. | 430/270.1 |
| 5,976,760 A * | 11/1999 | Oomori et al. | 430/270.1 |
| 5,985,507 A | 11/1999 | Blakeney et al. | 430/190 |
| 6,358,672 B2 * | 3/2002 | Jeoung et al. | 430/311 |
| 6,440,634 B1 | 8/2002 | Ohsawa et al. | 430/370.1 |

FOREIGN PATENT DOCUMENTS

| | | |
|---|---|---|
| EP | 1 099 983 | 5/2001 |
| JP | 6-148889 | 5/1994 |
| JP | 8-62844 | 3/1996 |
| JP | 2000-188250 | 7/2000 |
| JP | 2000-356850 | 12/2000 |

* cited by examiner

Primary Examiner—Mark F. Huff
Assistant Examiner—Sin J. Lee
(74) Attorney, Agent, or Firm—Wenderoth, Lind & Ponack, LLP

(57) ABSTRACT

The invention discloses a crosslinked chemical-amplification positive-working photoresist composition of good pattern resolution and storage stability, which is suitable for pattern size diminution by the thermal flow process after development. The composition comprises: (A) a polyhydroxystyrene resin substituted for a part of the hydroxyl hydrogen atoms by acid-dissociable solubility-reducing groups; (B) a radiation-sensitive acid-generating compound; (C) a polyvinyl ether compound as a crosslinking agent; (D) a carboxylic acid; and (E) an amine compound.

8 Claims, No Drawings

POSITIVE-WORKING PHOTORESIST COMPOSITION AND RESIST PATTERNING METHOD USING SAME

BACKGROUND OF THE INVENTION

The present invention relates to a positive-working photoresist composition having excellent storage stability to exhibit high pattern resolution and capable of giving a patterned resist layer with well controlled little temperature dependency of size changes by the thermal flow process as well as to a method for the formation of a patterned resist layer by using the same.

In the photolithographic patterning technology in recent years for the manufacture of fine electronic devices, a great variety of chemical-amplification positive-working photoresist compositions are proposed and widely employed by virtue of the excellent pattern resolution and high photosensitivity as compared with conventional positive-working photoresist compositions of old types such as those formulated with a naphthoquinone diazidosulfonic acid ester as the photosensitive ingredient and a novolak resin as the film-forming base resin ingredient. Some grades of the chemical-amplification positive-working photoresist compositions are already under practical applications in the patterning process of the design rule 0.25 to 0.18 $\mu$m.

On the other hand, the technology of semiconductor devices is under an increasing trend toward a higher and higher density of integration and, along with proceeding of mass production of LSIs with a design rule of about 0.15 $\mu$m, the photoresist compositions are required to comply with the demand for patterning of line-and-space patterns, hole patterns and isolated patterns with fineness of 0.12 to 0.18 $\mu$m by using KrF excimer laser beams as the exposure light.

A so-called crosslinked photoresist composition is disclosed in Japanese Patent Kokai 6-148889, 6-230574, 8-62844 and 9-274320 and elsewhere, which is a novel type of chemical-amplification positive-working photoresist composition compounded with a polyvinyl ether or polyvinyloxy compound.

When the crosslinked photoresist composition is applied to a substrate surface followed by a pre-baking treatment to form a dried photoresist layer, a thermal crosslinking reaction proceeds between the polyvinyl ether compound and the base resin ingredient and, by subjecting the photoresist layer to pattern-wise light exposure and post-exposure baking treatment, an acid compound is generated in the resist layer from the acid-generating agent contained therein and the acid acts to dissociate the acid-dissociable solubility-reducing groups in the resinous ingredient and the crosslinks formed in the pre-baking treatment so that the subsequent development treatment with an alkaline developer solution produces a patterned resist layer with high contrast between the exposed and unexposed areas and high pattern resolution where the patterned resist layer has excellent resistance against dry etching.

The above mentioned chemical-amplification positive-working photoresist composition of the crosslinked type, however, has a serious defect of low storage stability that the pattern resolution, cross sectional profile of the excellent patterned resist layer, photosensitivity and other properties of the composition as prepared are subject to degradation within several hours to several days.

As a recent development in the photolithographic patterning technology, the so-called thermal flow process is proposed in Japanese Patent Kokai 2000-188250 for accomplishing an increase in the fineness of the resist pattern by subjecting a patterned resist layer formed by a conventional photolithographic patterning process including the steps of pattern-wise light exposure, post-exposure baking treatment and development to a heat treatment to cause thermal flow of the resist layer.

This thermal flow process is applicable to any conventional photoresist compositions from which a patterned resist layer of improved fineness can be obtained in a relatively simple process without the disadvantage of great investment. On the other hand, this process has a problem that the temperature dependency of the size reduction of the resist pattern is uncontrollably great so that good reproducibility of pattern size reduction can hardly be obtained by the heat treatment of a patterned resist layer formed by development by using a conventional chemical-amplification photoresist composition.

SUMMARY OF THE INVENTION

Under the above described situations, the present invention has been completed with an object to provide a novel and improved positive-working photoresist composition having good storage stability and capable of giving a high-resolution patterned resist layer having excellent resistance against dry etching by applying the thermal flow process with a small dimensional change per unit temperature elevation.

Thus, the positive-working photoresist composition provided by the present invention comprises, as a uniform solution in an organic solvent:

(A) 100 parts by weight of a copolymer of hydroxystyrene as a resinous base ingredient of which at least a part of the phenolic hydroxyl groups or carboxyl groups are substituted for the hydrogen atoms thereof by acid-dissociable groups;

(B) from 1 to 20 parts by weight of a radiation-sensitive acid-generating compound;

(C) from 0.1 to 25 parts by weight of a polyvinyl ether compound having at least two vinyloxy groups in a molecule and susceptible to crosslinking;

(D) from 0.01 to 5 parts by weight of a carboxylic acid compound consisting of atoms of carbon, oxygen and hydrogen alone; and (E) from 0.01 to 1 part by weight of an amine compound.

Further, the method of the present invention for the formation of a patterned resist layer on the surface of a substrate comprises the steps of:

(a) coating the surface of a substrate with a positive-working photoresist composition defined above followed by drying to form a dried photoresist layer;

(b) exposing the dried photoresist layer on the substrate surface pattern-wise to light to form a latent image of the pattern;

(c) subjecting the photoresist layer after pattern-wise light exposure to a heat treatment;

(d) subjecting the photoresist layer to a development treatment with an aqueous alkaline solution as a developer to form a patterned resist layer; and (e) subjecting the patterned resist layer to a heat treatment to effect reduction of the pattern size by thermal flow of the resist layer.

DETAILED DESCRIPTION OF THE PREFERRED EMBODIMENTS

The photoresist composition of the present invention is a chemical-amplification positive-working photoresist composition in the form of a uniform solution in an organic solvent, of which the resinous base ingredient as the component (A) is a hydroxystyrene-based homopolymeric or copolymeric resin substituted for at least a part of the hydrogen atoms of the phenolic hydroxyl groups or carboxyl groups by acid-dissociable groups.

The acid-dissociable substituent groups on the resinous base ingredient as the component (A) have an effect of decreasing the solubility of the resin in an aqueous alkaline solution and, while the resist layer containing the resin as the component (A) is insoluble in an aqueous alkaline solution, the resist layer is imparted with increased alkali-soluble in the areas pattern-wise exposed to light by interacting with the acid generated and released from the radiation-sensitive acid-generating agent as the component (B) in the light-exposed areas of the resist layer. The acid-dissociable solubility-reducing substituent group on the hydroxystyrene-based polymeric resinous ingredient is not particularly limitative including lower alkoxyalkyl groups, tertiary alkoxycarbonyl groups, tertiary alkoxycarbonylalkyl groups, tertiary alkyl groups and cyclic ether groups as the preferable ones in respect of their acid-dissociability and heat resistance and cross sectional profile of the patterned resist layer obtained from the photoresist composition containing the same.

Examples of the lower alkoxyalkyl groups include 1-ethoxyethyl and 1-methoxypropyl groups. Examples of the tertiary alkoxycarbonyl groups include tert-butoxycarbonyl and tert-amyloxycarbonyl groups. Examples of the tertiary alkoxycarbonylalkyl groups include tert-butoxycarbonylmethyl, tert-butoxycarbonylethyl, tert-amyloxycarbonylmethyl and tert-amyloxycarbonylethyl groups. Examples of the tertiary alkyl groups include tert-butyl and tert-amyl groups. Examples of the cyclic ether groups include tetrahydropyranyl and tetrahydrofuranyl groups.

Thus, the resinous base ingredient as the component (A) is typically exemplified by polyhydroxystyrene resins substituted for the hydrogen atoms of 10 to 60% of the hydroxyl groups thereof by acid-dissociable substituent groups selected from lower alkoxyalkyl, tertiary alkoxycarbonyl, tertiary alkoxycarbonylalkyl and cyclic ether groups. Preferable examples of the resinous base ingredient as the component (A) include polyhydroxystyrene resins substituted for the hydrogen atoms of 10 to 60% of the hydroxyl groups thereof by 1-ethoxyethyl groups, tert-butoxycarbonyl groups, tert-butoxycarbonylmethyl groups, tert-butyl groups or tetrahydropyranyl groups.

Another class of preferable resinous base ingredients as the component (A) includes copolymeric resins consisting of from 10 to 49% by moles of hydroxystyrene units substituted for the hydrogen atoms of the hydroxyl groups by acid-dissociable groups such as tertiary alkyloxycarbonyl groups, tertiary alkyl groups and cyclic ether groups, from 10 to 49% by moles of hydroxystyrene units for the hydrogen atoms of the hydroxyl groups by alkoxyalkyl groups and from 2 to 80% by moles of hydroxystyrene units. Examples of preferable resinous ingredients belonging to this class include copolymeric resins consisting of from 10 to 49% by moles of hydroxystyrene units substituted for the hydrogen atoms of the hydroxyl groups by tert-butoxycarbonyl groups, from 10 to 49% by moles of hydroxystyrene units substituted for the hydrogen atoms of the hydroxyl groups by 1-ethoxyethyl groups and from 2 to 80% by moles of hydroxystyrene units, copolymeric resins consisting of from 10 to 49% by moles of hydroxystyrene units substituted for the hydrogen atoms of the hydroxyl groups by tert-butyl groups, from 10 to 49% by moles of hydroxystyrene units substituted for the hydrogen atoms of the hydroxyl groups by 1-ethoxyethyl groups and from 2 to 80% by moles of hydroxystyrene units and copolymeric resins consisting of from 10 to 49% by moles of hydroxystyrene units substituted for the hydrogen atoms of the hydroxyl groups by tetrahydropyranyl groups, from 10 to 49% by moles of hydroxystyrene units substituted for the hydrogen atoms of the hydroxyl groups by 1-ethoxyethyl groups and from 2 to 80% by moles of hydroxystyrene units.

Further, examples of the copolymeric resins as the component (A) consisting of (meth)acrylic acid ester units substituted for the carboxyl hydrogen atoms by acid-dissociable substituent groups, hydroxystyrene units and styrene units include copolymeric resins consisting of from 2 to 30% by moles of (meth)acrylic acid ester units substituted for the carboxyl hydrogen atoms by tert-butyl groups, from 40 to 80% by moles of hydroxystyrene units and from 10 to 40% by moles of styrene units and copolymeric resins consisting of from 2 to 30% by moles of (meth)acrylic acid ester units substituted for the carboxyl hydrogen atoms by 1-ethylcyclohexyl groups, from 40 to 80% by moles of hydroxystyrene units and from 10 to 40% by moles of styrene units. These polymeric or copolymeric resins should have a weight-average molecular weight in the range from 2000 to 50000 or, preferably, from 5000 to 25000 with a molecular weight dispersion Mw:Mn in the range from 1.0 to 5.0 or, preferably, from 1.0 to 2.0.

These polymeric or copolymeric resins can be used either singly or as a combination of two kinds or more as the component (A). Assuming that the resinous base ingredient as the component (A) is a combination of two different resins, it is preferable to employ a combination of (A1) a first polyhydroxystyrene resin substituted for the hydrogen atoms of a part of the hydroxyl groups by alkoxyalkyl groups as the acid-dissociable groups and (A2) a second polyhydroxystyrene resin substituted for the hydrogen atoms of a part of the hydroxyl groups by tertiary alkoxycarbonyl groups, tertiary alkyl groups or cyclic ether groups as the acid-dissociable groups in a weight proportion of (A1):(A2) in the range from 2:8 to 9:1 or, more preferably, from 4:6 to 9:1.

Examples of the first polyhydroxystyrene resin (A1) mentioned above include polyhydroxystyrene resins substituted for the hydrogen atoms of 10 to 60% of the hydroxyl groups by 1-ethoxyethyl groups and examples of the second polyhydroxystyrene resins (A2) include polyhydroxystyrene resins substituted for the hydrogen atoms of 10 to 60% of the hydroxyl groups by tert-butoxycarbonyl groups, tert-butyl groups or tetrahydropyranyl groups.

The component (B) formulated in the inventive photoresist composition is a compound capable of generating and releasing an acid when irradiated with actinic rays, referred to as an acid-generating agent hereinafter, which is not particularly limitative and any one of those conventionally formulated in chemical-amplification photoresist compositions can be used here. Examples of preferable acid-generating compounds as the component (B), however, include diazomethane-based acid-generating compounds and onium salts with fluoroalkylsulfonic acid ions of which the alkyl group has 1 to 15 carbon atoms.

Particular examples of the diazomethane-based compounds suitable as the component (B) include bis(4-toluenesulfonyl) diazomethane, bis(1,1-dimethylethylsulfonyl)diazomethane, bis (cyclohexylsulfonyl)diazomethane and bis(2,4-dimethylphenylsulfonyl)diazomethane.

Particular examples of the onium salts suitable as the component (B) include diphenyliodonium trifluoromethanesulfonate and nonafluorobutanesulfonate, bis(4-tert-butylphenyl)iodonium trifluoromethanesulfonate and nonafluorobutanesulfonate, triphenylsulfonium trifluoromethanesulfonate and nonafluorobutanesulfonate and tri(4-methylphenyl)sulfonium trifluoromethanesulfonate and nonafluorobutanesulfonate, of which diphenyliodonium bis(4-tert-butylphenyl)iodonium trifluoromethanesulfonate and nonafluorobutanesulfonate are preferable.

The above named acid-generating compounds as the component (B) can be used either singly or as a combination of two kinds or more. The amount of the component (B) contained in the inventive photoresist composition is in the range from 1 to 20 parts by weight per 100 parts by weight of the component (A). When the amount thereof is too small, a patterned image can hardly be formed with the photoresist composition while, when too large, the photoresist composition cannot be in the form of a uniform solution due to limited solubility of the compound in an organic solvent or, even if a uniform solution could be obtained, the solution suffers decreased storage stability.

The third essential ingredient contained in the inventive photoresist composition as the component (C) is a crosslinking polyvinyl ether compound or polyvinyloxy compound which serves to effect thermal crosslinking with the resinous base ingredient when the coating layer of the inventive photoresist composition on the substrate surface is dried by heating in step (a) according to the inventive method.

The component (C) serves as a crosslinking agent to effect thermal crosslinking with the resinous ingredient as the component (A) in the course of formation of the photoresist layer by drying the coating layer of the composition under heating. Though not particularly limitative, it is preferable that the crosslinking polyvinyl ether compound having at least two vinyl ether groups or vinyloxy groups in a molecule is a compound represented by the general formula

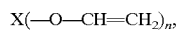

in which the subscript n is an integer of 2, 3 or 4 and X is an n-valent hydrocarbon residue derived from a polyhydric hydrocarbon compound having n hydroxyl groups by eliminating n hydrogen atoms of the hydroxyl groups. Namely, the compound is derived from a polyoxyalkyleneglycol such as alkyleneglycols, dialkyleneglycols and trialkyleneglycols or a polyhydric alcohol such as trimethylolpropane, pentaerythritol and pentaglycol by substitution of vinyloxy groups for at least two of the hydroxyl groups.

The above mentioned hydrocarbon residue has a straightly linear or branched structure derived from an alkylene group having up to 8 carbon atoms with or without an alicyclic group of 4 to 6 carbon atoms. Examples of the above mentioned polyhydric hydrocarbon compound include ethyleneglycol divinyl ether, triethyleneglycol divinyl ether, 1,3-butanediol divinyl ether, tetramethyleneglycol divinyl ether, neopentaneglycol divinyl ether, trimethylolpropane trivinyl ether, trimethylolethane trivinyl ether, hexanediol divinyl ether, 1,4-cyclohexanediol divinyl ether, tetraethyleneglycol divinyl ether, pentaerythritol divinyl ether, pentaerythritol trivinyl ether and cyclohexanedimethyl alcohol divinyl ether, of which those having an alicyclic hydrocarbon group such as cyclohexanedimethyl alcohol divinyl ether are preferable.

The above named polyvinyl ether compounds as the component (C) can be used either singly or as a combination of two kinds or more. The amount of the component (C) contained in the inventive photoresist composition is in the range from 0.1 to 25 parts by weight or, preferably, from 1 to 15 parts by weight per 100 parts by weight of the component (A).

The component (D) compounded in the inventive photoresist composition is a carboxylic acid which necessarily consists of the elements of carbon, oxygen and hydrogen alone to be free from other elements such as nitrogen and sulfur. Such a carboxylic acid is selected from saturated or unsaturated aliphatic carboxylic acids which may be substituted by a hydroxyl group, alicyclic carboxylic acids and aromatic carboxylic acids.

Examples of the above mentioned saturated carboxylic acids include formic acid, acetic acid, propionic acid, dodecanoic acid, butyric acid, isobutyric acid, oxalic acid, malonic acid, succinic acid, glutaric acid and adipic acid. Examples of the unsaturated aliphatic carboxylic acids include acrylic acid, crotonic acid, isocrotonic acid, 3-butenoic acid, methacrylic acid, 4-pentenoic acid, 2-butynoic acid, maleic acid, fumaric acid and acetylenecarboxylic acid. Examples of the alicyclic carboxylic acids include 1,1-cyclohexane dicarboxylic acid, 1,2-cyclohexane dicarboxylic acid, 1,3-cyclohexane dicarboxylic acid, 1,4-cyclohexane dicarboxylic acid and 1,1-cyclohexane diacetic acid. Examples of the aromatic carboxylic acids include 4-hydroxybenzoic acid, 2-hydroxybenzoic acid, 2-hydroxy-3-nitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, phthalic acid, terephthalic acid and isophthalic acid. Among the carboxylic acids belonging to these classes, maleic acid, malonic acid, dodecanoic acid and salicylic acid are particularly preferable, although any of these carboxylic acids can be used either singly or as a combination of two kinds or more.

The amount of the carboxylic acid as the component (D) compounded in the inventive photoresist composition is in the range from 0.01 to 5 parts by weight or, preferably, from 0.05 to 1 part by weight per 100 parts by weight of the component (A).

The component (E) compounded in the inventive photoresist composition is an amine compound which is preferably a secondary or tertiary aliphatic amine compound. Examples of the amine compounds suitable as the component (E) include dimethylamine, trimethylamine, diethylamine, triethylamine, tri-n-propylamine, triisopropylamine, tri-n-butylamine, triisobutylamine, tri-tert-butylamine, tripentylamine, diethanolamine, triethanolamine and tributanolamine, of which di- and trialkanol amine compounds such as diethanolamine, triethanolamine and tributanolamine are particularly preferable, although any of the above named amine compounds can be used either singly or as a combination of two kinds or more.

The amount of the amine compound as the component (E) compounded in the inventive photoresist composition is in the range from 0.01 to 1 part by weight or, preferably, from 0.05 to 0.7 part by weight per 100 parts by weight of the component (A).

It is convenient that the photoresist composition of the present invention is used in the form of a solution prepared by uniformly dissolving the above-described essential ingredients and optional ingredients mentioned below in an organic solvent. Examples of the organic solvents suitable for the purpose include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more.

It is of course optional that the inventive photoresist composition comprising the above-described essential components (A) to (E) is further admixed with a variety of additives known in the art of photoresist compositions such as auxiliary resins to improve the properties of the resist layer, plasticizers, stabilizers, coloring agents, surface active agents and others each in a limited amount.

The method for the formation of a patterned resist layer by using the inventive photoresist composition is basically not different from that in the prior art excepting for some improvements. A typical procedure therefor comprises: a step in which a substrate such as a semiconductor silicon wafer, optionally, provided with an anti-reflection coating film is uniformly coated with the photoresist composition in the form of a solution by using a suitable coating machine such as a spinner followed by drying by heating to form a dried photoresist layer on the substrate surface; a step in which the photoresist layer is pattern-wise exposed to KrF excimer laser beams through a photomask bearing the desired pattern followed by a post-exposure baking treatment to form a latent image of the pattern; a step for the development treatment of the latent image with an aqueous alkaline developer solution which is typically a 0.1 to 10% by weight aqueous solution of tetramethylammonium hydroxide to form a patterned resist layer; and a step of heat treatment of the patterned resist layer to cause diminishing of the resist patter size by thermal flow of the patterned resist layer.

In the inventive method for the formation of a patterned resist layer according to the above described general procedure, it is essential that the photoresist layer on the substrate surface before the pattern-wise light exposure as formed by coating with the photoresist solution is subjected to a heat treatment at a temperature in the range from 80 to 150° C. for a length of time in the range from 30 to 120 seconds to effect drying.

The above mentioned post-exposure baking treatment is conducted on a hot plate at a temperature in the range from 90 to 150° C. for 30 to 120 seconds and the pattern size-diminishing heat treatment of the patterned resist layer is conducted on a hot plate at a temperature in the range from 110 to 180° C. for 130 to 180 seconds.

While the crosslinking polyvinyl ether compound as the component (C) has an effect to decrease the storage stability of the inventive photoresist composition, this effect of stability decreasing can be compensated by the combined use of the components (D) and (E). In the step of thermal flow of the patterned resist layer, a crosslinking reaction proceeds in the resist layer increasing the molecular weight of the resinous ingredient so that the resist layer is imparted with increased resistance against dry etching. The dimensional changes per unit temperature elevation can be controlled low, which should not exceed 15 nm/° C. or, preferably, 5 nm/° C. The above mentioned diminishing dimensional change of a patterned resist layer is determined by stepwise increasing the temperature of a patterned resist layer having a hole pattern of 180 nm diameter from 124 to 140° C. in a 2° C. increment and keeping the resist layer for 60 seconds at each temperature to cause diminution of the hole pattern diameter to 80 nm.

In the following, the photoresist composition of the present invention is described in more detail by way of Examples, which, however, never limit the scope of the present invention in any way.

In the following Examples, the photoresist compositions prepared there were estimated for the following properties by the respective testing procedure described there.

(1) Photosensitivity

A semiconductor silicon wafer provided on one surface with a 0.12 $\mu$m thick anti-reflection coating film of an anti-reflection coating agent (SWK-EX2, a product by Tokyo Ohka Kogyo Co.) was coated with the photoresist composition after storage for 24 hours from preparation by using a spinner followed by heating on a hot plate at 90° C. for 90 seconds to form a dried photoresist layer having a thickness of 0.5 $\mu$m. The photoresist layer was exposed pattern-wise to KrF excimer laser beams through a pattern-bearing photomask on a minifying projection exposure machine (Model FPA-3000EX3, manufactured by Canon Co.) in an exposure dose increased stepwise in an increment of 1 mJ/cm$^2$ followed by a post-exposure baking treatment at 110° C. for 90 seconds and then by a development treatment at 23° C. for 60 seconds with a 2.38% aqueous solution of tetramethylammonium hydroxide to give a patterned resist layer by rinse with water for 30 seconds and drying. The minimum exposure dose, by which the photoresist layer in the exposed areas was completely removed by the development treatment, was taken as the photosensitivity and recorded in the unit of mJ/cm$^2$.

(2) Cross Sectional Profile of Patterned Resist Layer

A scanning electron microscopic photograph was taken of the cross section of a patterned resist layer of a line-and-space pattern of 0.25 $\mu$m line width obtained in the same manner as in (1) above and the cross sectional profile was recorded in three ratings of: A for an orthogonal profile; B for an upwardly narrowing trapezoidal profile; and C for a downwardly narrowing trapezoidal profile.

(3) Pattern Resolution

The critical resolution was examined on the line-and-space patterned resist layer obtained in (1) above.

(4) Thermal Flow Behavior

The patterned resist layer obtained in (1) above was heated to cause thermal flow which was examined for a contact hole pattern of 0.25 $\mu$m diameter and the flow rate, i.e. changes in the pattern size per ° C., was measured in nm/° C. and recorded in four ratings of: A for a rate not exceeding 5 nm/° C.; B for a rate of 5 to 15 nm/° C.; and C for a rate exceeding 15 nm/° C.

(5) Storage Stability

The same evaluation tests (1), (2) and (3) described above were repeated with the same photoresist composition but after storage for 24 days at room temperature and the results of the respective items were compared with the results in (1) to (3) above.

EXAMPLE 1

A positive-working photoresist composition was prepared by uniformly dissolving, in 490 parts by weight of propyleneglycol monomethyl ether acetate, 75 parts by weight of a first polyhydroxystyrene resin having a weight-average molecular weight of 10000 with a molecular weight dispersion of 1.2, of which 39% of the hydroxyl groups were substituted for the hydrogen atoms by 1-ethoxyethyl groups, 25 parts by weight of a second polyhydroxystyrene resin having a weight-average molecular weight of 10000 with a molecular weight dispersion of 1.2, of which 36% of the hydroxyl groups were substituted for the hydrogen atoms by tert-butoxycarbonyl groups, 5 parts by weight of bis (cyclohexylsulfonyl) diazomethane, 5 parts by weight of 1,4-cyclohexane dimethanol divinyl ether, 0.1 part by weight of salicylic acid and 0.2 part by weight of triethylamine followed by filtration through a membrane filter of 0.2 μm pore diameter. The results obtained by the evaluation tests of this photoresist composition are summarized in Table 1 below. The results given under the headings of (1), (2) and (3) are for the photoresist compositions after 24 hours from preparation and those given under the headings of (1'), (2') and (3') are for the same compositions after 24 days storage.

EXAMPLE 2

The experimental procedure was substantially the same as in Example 1 except that the photoresist composition was prepared by omitting the second polyhydroxystyrene resin and increasing the amount of the first polyhydroxystyrene resin from 75 to 100 parts by weight. The results of the evaluation tests are summarized in Table 1.

EXAMPLE 3

The experimental procedure was substantially the same as in Example 1 except that the photoresist composition was prepared by decreasing the amount of the first polyhydroxystyrene resin from 75 to 50 parts by weight and replacing 25 parts by weight of the second polyhydroxystyrene resin with 50 parts by weight of a third polyhydroxystyrene resin having a weight-average molecular weight of 10000 with a molecular weight dispersion of 1.2, of which 30% of the hydroxyl groups were substituted for the hydrogen atoms by tetrahydropyranyl groups. The results of the evaluation tests are summarized in Table 1.

EXAMPLE 4

The experimental procedure was substantially the same as in Example 1 except that the photoresist composition was prepared by decreasing the amount of the first polyhydroxystyrene resin from 75 to 60 parts by weight and replacing 25 parts by weight of the second polyhydroxystyrene resin with 40 parts by weight of a fourth polyhydroxystyrene resin having a weight-average molecular weight of 10000 with a molecular weight dispersion of 1.2, of which 30% of the hydroxyl groups were substituted for the hydrogen atoms by tert-butyl groups. The results of the evaluation tests are summarized in Table 1.

EXAMPLE 5

The experimental procedure was substantially the same as in Example 1 except that the photoresist composition was prepared by replacing the first and second polyhydroxystyrene resins with a combination of 60 parts by weight of a first copolymeric resin having a weight-average molecular weight of 10000 and consisting of 65% by moles of hydroxystyrene units, 20% by moles of styrene units and 15% by moles of tert-butyl acrylate units and 40 parts by weight of a second copolymeric resin having a weight-average molecular weight of 10000 and consisting of 75% by moles of hydroxystyrene units, 20% by moles of styrene units and 5% by moles of tert-butyl acrylate units. The results of the evaluation tests are summarized in Table 1.

COMPARATIVE EXAMPLE 1

The experimental procedure was substantially the same as in Example 1 except that the photoresist composition was prepared by omitting salicylic acid in the formulation. The results of the evaluation tests are summarized in Table 1.

COMPARATIVE EXAMPLE 2

The experimental procedure was substantially the same as in Example 1 except that the photoresist composition was prepared by omitting triethylamine in the formulation. The results of the evaluation tests are summarized in Table 1.

COMPARATIVE EXAMPLE 3

The experimental procedure was substantially the same as in Example 2 except that the photoresist composition was prepared by omitting salicylic acid in the formulation. The results of the evaluation tests are summarized in Table 1.

COMPARATIVE EXAMPLE 4

The experimental procedure was substantially the same as in Example 2 except that the photoresist composition was prepared by omitting triethylamine in the formulation. The results of the evaluation tests are summarized in Table 1.

COMPARATIVE EXAMPLE 5

The experimental procedure was substantially the same as in Example 1 except that the photoresist composition was prepared by omitting 1,4-cyclohexane dimethanol divinyl ether in the formulation. The results of the evaluation tests are summarized in Table 1.

TABLE 1

| | | Photosensitivity, mJ/cm$^2$ | | Cross sectional profile of patterned resist layer | | Pattern resolution, μm | | Thermal flow behavior |
|---|---|---|---|---|---|---|---|---|
| | | (1) | (1') | (2) | (2') | (3) | (3') | |
| Example | 1 | 45 | 45 | A | A | 0.19 | 0.19 | A |
| | 2 | 47 | 47 | A | A | 0.18 | 0.18 | B |
| | 3 | 45 | 45 | A | A | 0.19 | 0.19 | A |
| | 4 | 45 | 45 | A | A | 0.20 | 0.20 | A |
| | 5 | 25 | 25 | A | A | 0.19 | 0.19 | A |
| Comparative Example | 1 | 30 | 30 | C | C | 0.24 | 0.24 | B |
| | 2 | 20 | 33 | B | B | 0.25 | 0.25 | B |
| | 3 | 20 | 20 | C | C | 0.23 | 0.23 | C |
| | 4 | 18 | 28 | B | B | 0.23 | 0.23 | C |
| | 5 | 35 | 35 | A | A | 0.20 | 0.21 | C |

What is claimed is:

1. A positive-working photoresist composition which comprises, as a uniform solution in an organic solvent:
   (A) 100 parts by weight of a hydroxystyrene-based polymer which is a combination of:
   (A1) a first polyhydroxystyrene resin having phenolic hydroxyl groups a part of which are substituted for the hydrogen atoms thereof by acid-dissociable alkoxyalkyl groups; and
   (A2) a second polyhydroxystyrene resin having phenolic hydroxyl groups a part of which are substituted for the hydrogen atoms thereof by acid-dissociable groups selected from the group consisting of tertiary alkoxycarbonyl groups, tertiary alkyl groups and cyclic ether groups, and
   wherein the weight proportion of the first polyhydroxystyrene resin (A1) to the second polyhydroxystyrene resin (A2) is in range from 2:8 to 9:1;
   (B) from 1 to 20 parts by weight of a radiation-sensitive acid-generating compound;

(C) from 0.1 to 25 parts by weight of a polyvinyl ether compound susceptible to crosslinking, represented by the formula $$X(\text{—O—CH=CH}_2)_n,$$

in which the subscript n is a positive integer of 2, 3 or 4 and X is an n-valent organic residue derived from a molecule of alicyclic hydrocarbon compound by eliminating n hydrogen atoms;

(D) from 0.01 to 5 parts by weight of a carboxylic acid consisting of atoms of carbon, oxygen and hydrogen alone; and (E) from 0.01 to 1 part by weight of an amine compound.

2. The positive-working photoresist composition as claimed in claim 1 in which the carboxylic acid as the component (D) is selected from the group consisting of aliphatic carboxylic acids, alicyclic carboxylic acids and aromatic carboxylic acids.

3. The positive-working photoresist composition as claimed in claim 2 in which the carboxylic acid as the component (D) is maleic acid, malonic acid, dodecanoic acid or salicylic acid.

4. The positive-working photoresist composition as claimed in claim 1 in which the amine compound as the component (E) is a secondary or tertiary aliphatic amine compound.

5. The positive-working photoresist composition as claimed in claim 4 in which the amine compound as the component (E) is a secondary or tertiary alkanol amine compound.

6. The positive-working photoresist composition as claimed in claim 1, wherein the polyvinyl ether compound as the component (C) is 1,4-cyclohexanedimethyl alcohol divinyl ether.

7. A method for the formation of a patterned resist layer on the surface of a substrate which comprises the steps of:

(a) coating the surface of a substrate with the positive-working photoresist composition which comprises, as a uniform solution in an organic solvent:

(A) 100 parts by weight of a hydroxystyrene-based polymer having phenolic hydroxyl groups or carboxyl groups as a resinous base ingredient of which at least a part of the phenolic hydroxyl groups or carboxyl groups are substituted for the hydrogen atoms thereof by acid-dissociable groups;

(B) from 1 to 20 parts by weight of a radiation-sensitive acid-generating compound;

(C) from 0.1 to 25 parts by weight of a polyvinyl ether compound susceptible to crosslinking, represented by the formula $$X(\text{—O—CH=CH}_2)_n,$$

in which the subscript n is a positive integer of 2, 3 or 4 and X is an n-valent organic residue derived from a molecule of alicyclic hydrocarbon compound by eliminating n hydrogen atoms;

(D) from 0.01 to 5 parts by weight of a carboxylic acid consisting of atoms of carbon, oxygen and hydrogen alone; and (E) from 0.01 to 1 part by weight of an amine compound;

followed by drying to form a dried photoresist layer;

(b) exposing the dried photoresist layer on the substrate surface pattern-wise to light to form a latent image of the pattern;

(c) subjecting the photoresist layer after pattern-wise light exposure to a heat treatment;

(d) subjecting the photoresist layer to a development treatment with an aqueous alkaline solution as a developer to form a patterned resist layer; and (e) subjecting the patterned resist layer to a heat treatment to effect diminution of the pattern size by thermal flow of the resist layer.

8. The method for the formation of a patterned resist layer as claimed in claim 7 in which the patterned resist layer exhibits a diminishing change in a dimension by increasing the temperature by an amount not exceeding 15 nm per degree centigrade of the temperature change.

* * * * *